United States Patent
Ishikawa et al.

(10) Patent No.: US 10,820,460 B2
(45) Date of Patent: Oct. 27, 2020

(54) CUTTING AND BENDING DEVICE

(71) Applicant: FUJI CORPORATION, Chiryu-shi (JP)

(72) Inventors: Nobuyuki Ishikawa, Nagoya (JP); Noriaki Iwaki, Hekinan (JP)

(73) Assignee: FUJI CORPORATION, Chiryu-shi (JP)

( * ) Notice: Subject to any disclaimer, the term of this patent is extended or adjusted under 35 U.S.C. 154(b) by 286 days.

(21) Appl. No.: 15/763,898

(22) PCT Filed: Oct. 6, 2015

(86) PCT No.: PCT/JP2015/078317
§ 371 (c)(1),
(2) Date: Mar. 28, 2018

(87) PCT Pub. No.: WO2017/060974
PCT Pub. Date: Apr. 13, 2017

(65) Prior Publication Data
US 2018/0279522 A1    Sep. 27, 2018

(51) Int. Cl.
*B23P 19/00* (2006.01)
*H05K 13/04* (2006.01)
*H05K 13/08* (2006.01)

(52) U.S. Cl.
CPC ......... *H05K 13/0473* (2013.01); *H05K 13/08* (2013.01)

(58) Field of Classification Search
CPC .......................... H05K 13/08; H05K 13/0473
See application file for complete search history.

(56) References Cited

U.S. PATENT DOCUMENTS 4,215,469 A * 8/1980 Asai ................. B23P 19/00
  29/835
7,568,284 B2 * 8/2009 Kadota ............ H05K 13/0439
  29/837
(Continued)

FOREIGN PATENT DOCUMENTS

JP    4-320400 A    11/1992
JP    2004-14934 A    1/2004
(Continued)

OTHER PUBLICATIONS

International Search Report dated Dec. 22, 2015 in PCT/JP2015/078317 filed Oct. 6, 2015.
(Continued)

*Primary Examiner* — Paul D Kim
(74) *Attorney, Agent, or Firm* — Oblon, McClelland, Maier & Neustadt, L.L.P.

(57) ABSTRACT

A cut and clinch device that bends leads of a leaded component into at least one of an bent-in state, a bent-out state, or an N-bent state. The bent-in state is a state with a pair of leads bent inside by moving a pair of movable sections towards each other. The bent-out state is a state with a pair of leads bent outside by moving a pair of movable sections away from each other. The N-bent state is a state with a pair of leads bent into an N-shape by moving a pair of slide bodies towards each other, moving a pair of movable sections away from each other, and then rotating the pair of slide bodies around a center point. Thus, leads can be bent into various states, and a leaded component can be appropriately mounted on a board.

5 Claims, 14 Drawing Sheets

(56) References Cited

U.S. PATENT DOCUMENTS

| | | | |
|---|---|---|---|
| 9,949,420 B2* | 4/2018 | Asao | H05K 13/0473 |
| 10,178,820 B2* | 1/2019 | Degura | G06K 7/1417 |
| 10,375,869 B2* | 8/2019 | Nakanishi | H05K 13/0015 |
| 10,721,851 B2* | 7/2020 | Iwata | H05K 13/0404 |
| 2016/0270273 A1 | 9/2016 | Asao et al. | |

FOREIGN PATENT DOCUMENTS

| | | |
|---|---|---|
| JP | 2011-119554 A | 6/2011 |
| JP | WO 2015/063827 A1 | 5/2015 |
| WO | 2015-145730 A1 | 10/2015 |

OTHER PUBLICATIONS

Extended European Search Report dated Aug. 21, 2018 in Patent Application No. 15905794.2, 10 pages.

* cited by examiner

CUTTING AND BENDING DEVICE

TECHNICAL FIELD

The present application relates to a cutting and bending device that cuts and bends leads when mounting a leaded component on a board, and to a cutting device that cuts leads when mounting a leaded component on a board.

BACKGROUND ART

When mounting a leaded component on a board, as disclosed in the patent literature below, leads are inserted into through-holes formed in the board, and the leads are cut and bent.
Patent literature 1: JP-A-H4-320400

BRIEF SUMMARY

Technical Problem

According to technology disclosed in the above patent literature, it is possible to a certain extent to appropriately mount leaded components on a board. However, it is possible to more appropriately mount a leaded component on a board by appropriately cutting a lead, or by appropriately cutting and bending a lead. The present disclosure takes account of such circumstances and an object thereof is to appropriately mount a leaded component on a board.

Solution to Problem

To solve the above problems, a cutting and bending device of the present disclosure includes: a control device including a first operation control section configured to bend a pair of leads of a leaded component towards each other in a first direction that is a direction in which the pair of leads are lined up after the pair of leads has been cut, a second operation control section configured to bend the pair of leads of the leaded component away from each other in the first direction, and a third operation control section configured to bend the pair of leads of the leaded component away from each other in a direction that is different to the first direction.

To solve the above problems, a cutting device of the present disclosure includes a pair of main body sections each including (A) a first section in which is formed a first through-hole, and (B) a second section in which is formed a second through-hole formed so as to overlap with the first through-hole and that is configured to slide with respect to the first section; a holding section configured to hold the pair of main body sections so as to move towards and away from each other in the sliding direction of the second section; and a control section, wherein the control section is configured to insert the leads into the first through-hole and the second through-hole that are overlapping and, in a state with the pair of main body sections moved in one direction out of the direction towards each other and the direction away from each other, slide the pair of second sections in an opposite direction to the one direction so as to cut the pair of leads.

Advantageous Effects

With a cutting and bending device of the present disclosure, it is possible to bend a pair leads to the inside, to bend a pair of leads to the outside, and to bend a pair of leads in an N-shape. Thus, leads can be bent into various states, and a leaded component can be appropriately mounted on a board.

Also, with a cutting device of the present disclosure, in a state with leads inserted into a first through-hole and a second through-hole of a main body section, the pair of main body sections are moved in one direction of a direction towards each other and a direction away from each other. Further, the pair of second sections are slid in another direction that is opposite to the one direction. Thus, leads bent by the movement of the main body sections can be returned to a straight line by the sliding of the second section. In this manner, according to a cutting device of the present disclosure, it is possible to straighten a cut lead, and to appropriately mount a leaded component on a board.

DESCRIPTION OF PREFERRED EMBODIMENTS

Figure 1:
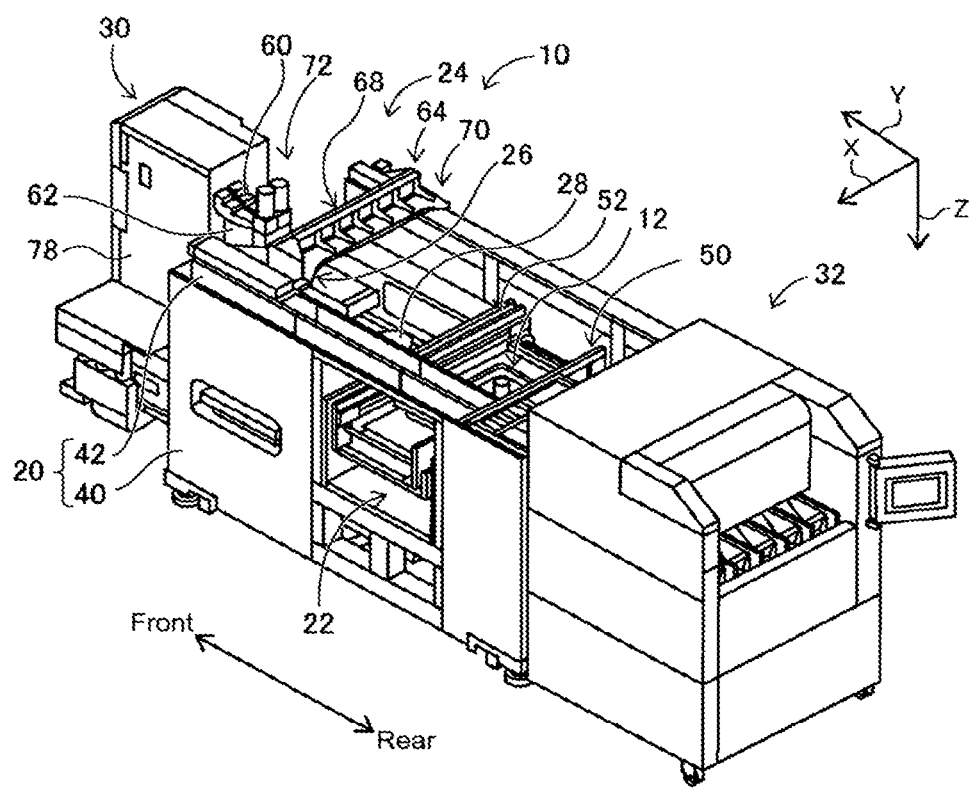
FIG. 1 is a perspective view of a component mounter.

The following describes in detail referring to the figures an example embodiment of the present disclosure.
Configuration of Component Mounter FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 3) 34, and control device (refer to FIG. 7) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
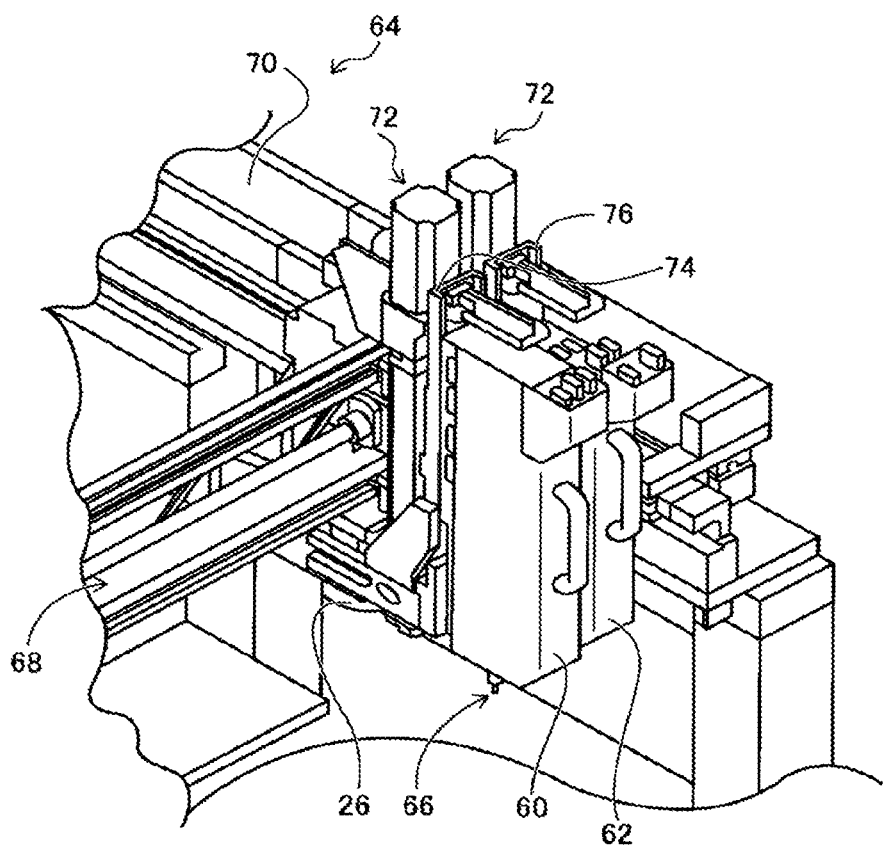
FIG. 2 is a perspective view of a component mounting device.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 7) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation.

Note that, components supplied by component supply device 30 and loose component supply device 32 may include electronic circuit components, configuration components of solar panels, configuration components of power modules, and the like. Also, electronic circuit components include components with leads and components without leads.

Figure 3:
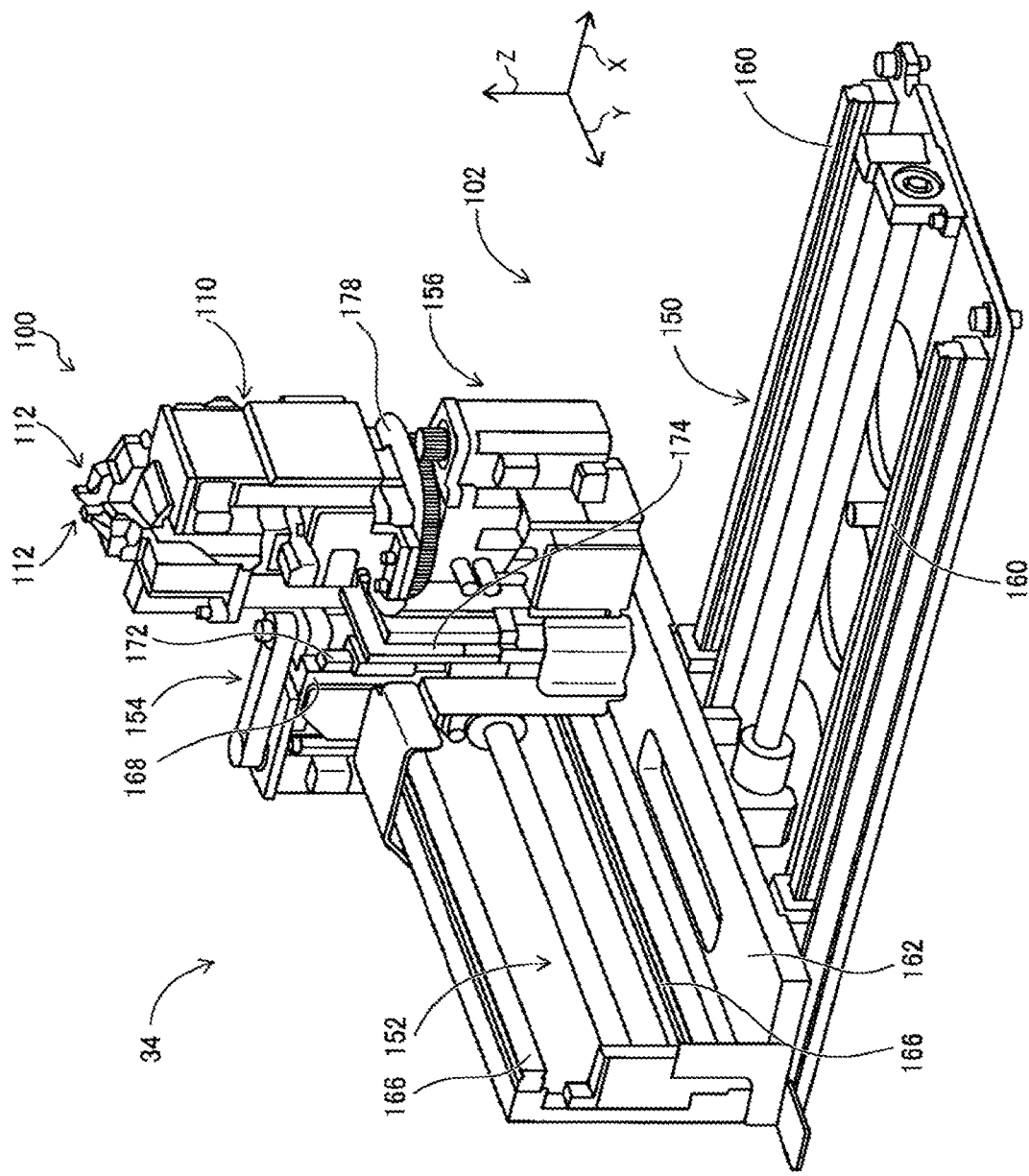
FIG. 3 is a perspective view of a cut and clinch device.
Figure 4:
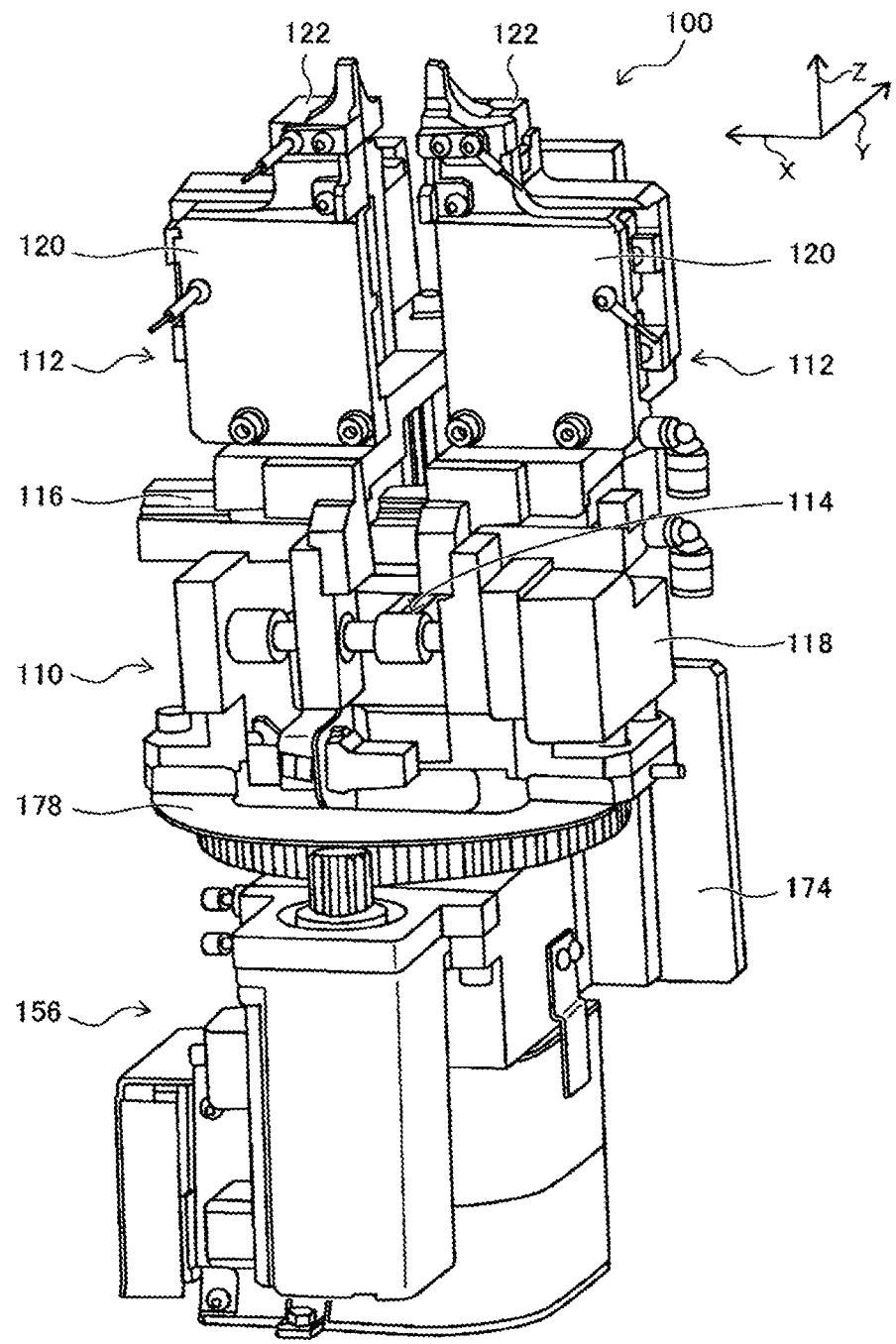
FIG. 4 is a perspective view of a cut and clinch unit.

Cut and clinch device 34 is arranged below conveyance device 50 and, as shown in FIG. 3, includes cut and clinch unit 100 and unit moving device 102. As shown in FIG. 4, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. By this, the pair of slide bodies 112 move towards and away from each other in the X direction. Also, pitch changing mechanism 114 includes electromagnetic motor 118, and the distance between the pair of slide bodies 112 can be controllably changed by operation of electromagnetic motor 118.

Figure 5:
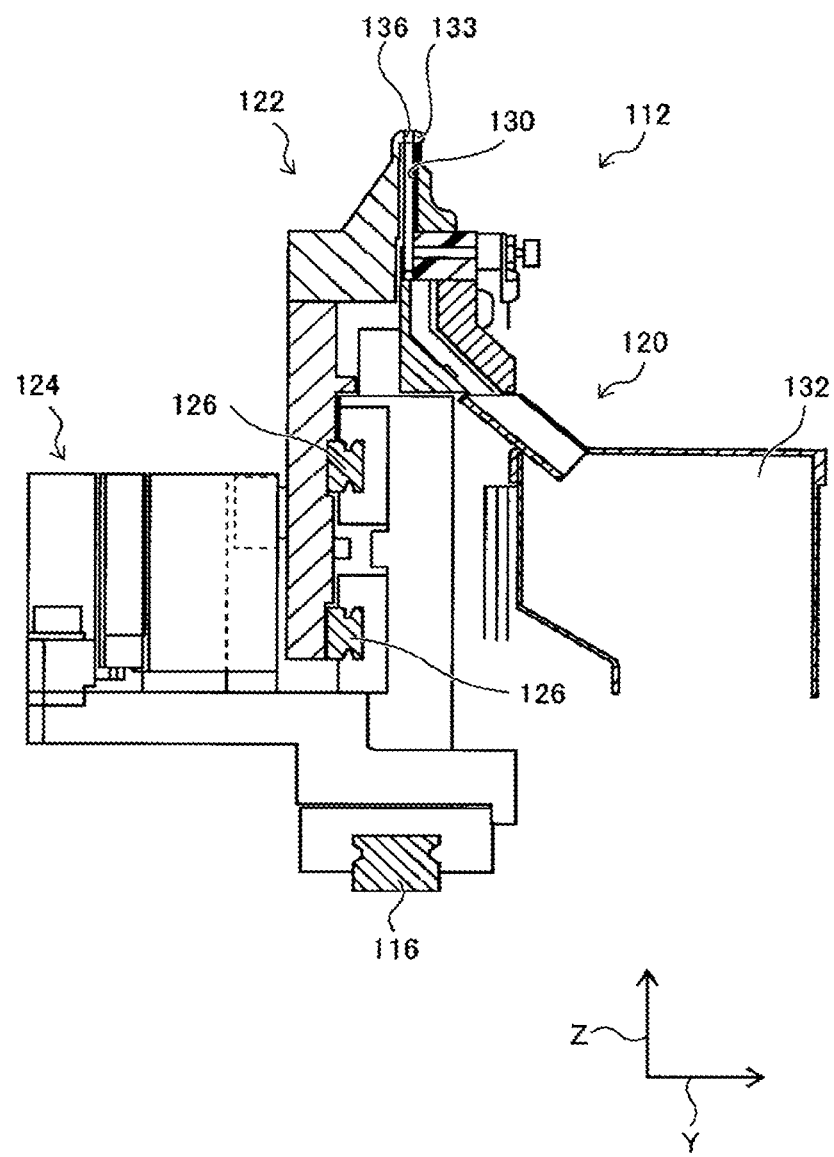
FIG. 5 is a cross section of a slide body.

Also, as shown in FIG. 5, each of the pair of slide bodies 112 includes fixed body section 120, movable section 122, and slide device 124, and is supported at fixed body section 120 so as to be slidable on slide rail 116. Two slide rails 126 are fixed to the rear side of fixed body section 120 extending in the X direction, and movable section 122 is slidably supported by those two slide rails 126. Thus, movable section 122 slides in the X direction with respect to fixed section 120. Also, slide device 124 includes electromagnetic motor (refer to FIG. 7) 128, and movable section 122 is controllably slid by operation of electromagnetic motor 128.

Also, the upper end section of fixed body section 120 is formed tapered towards the end, and first insertion hole 130 is formed so as to pierce the upper end section in a vertical direction. The upper end of first insertion hole 130 opens at the upper end surface of fixed section 120, and the edge that opens to the upper end surface is formed as fixed blade (refer to FIG. 8) 131. Also, the lower end of first insertion hole 130 opens to a side surface of fixed section 120, and discard box 132 is provided below the opening to the side surface.

Figure 6:
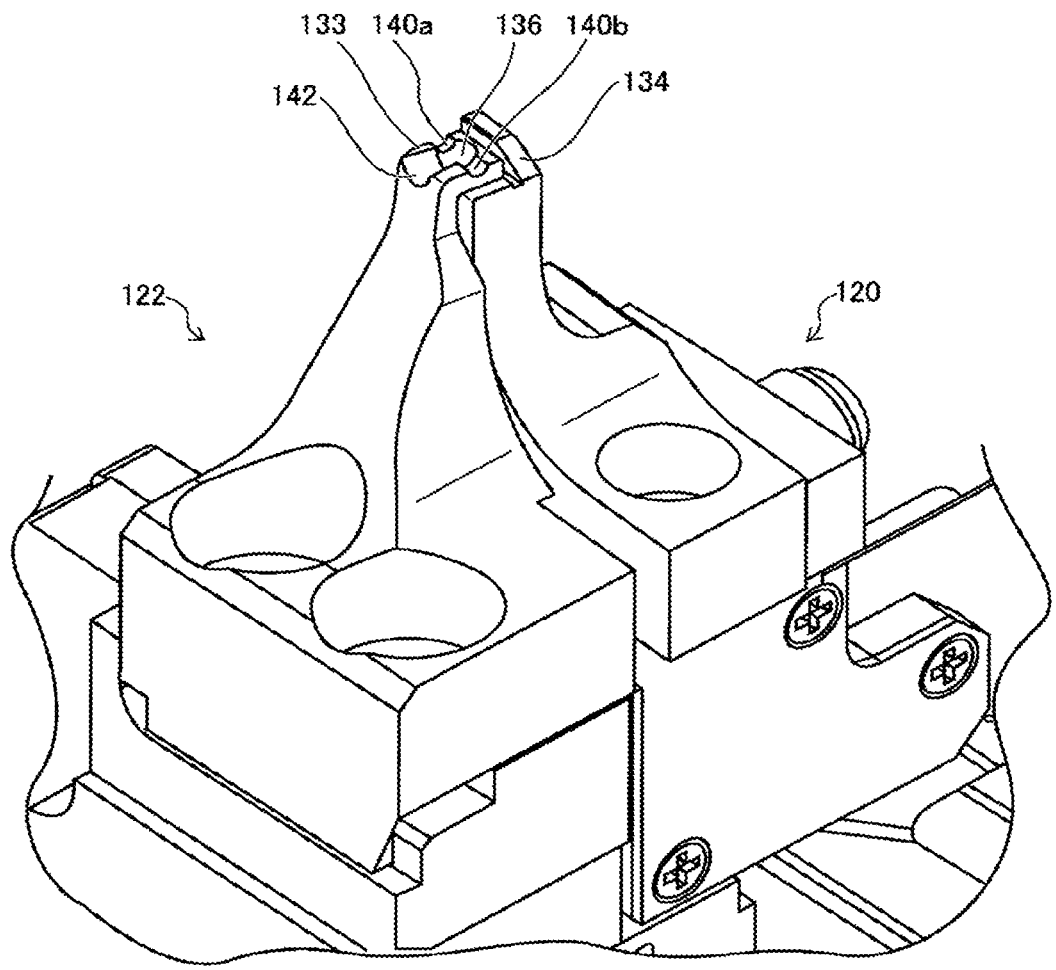
FIG. 6 is an enlarged view of the slide body.

Further, as shown in FIG. 6, an upper end section of movable section 122 is also formed tapered towards the end, and L-shaped curved section 133 is formed at the upper end section of movable section 122. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Note that, the tip of curved section 133 extends part way to the upper end surface of fixed section 120, such that a portion of the upper end surface of fixed section 120 is exposed. Protruding section 134 that extends upwards from curved section 133 is formed on an exposed portion of the upper end surface. That is, protruding section 134 is formed on the upper end surface of fixed section 120 so as to face the tip of curved section 133.

Further, second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of fixed section 120 is not a tapered surface, the internal surface of insertion hole 130 approaching the opening has an approximately regular diameter. Also, the edge of second insertion hole 136 that opens to the lower end surface of curved section 133 is formed as movable blade 138 (refer to FIG. 8).

Note that, first guide groove 140 is formed in the upper end surface of curved section 133 extending in the X-axis direction, that is, the sliding direction of movable section 122. First guide groove 140 is formed to straddle the opening of second insertion hole 136, and first guide groove 140 and second insertion hole 136 are linked. Also, first guide groove 140 is open at both side surfaces of curved section 133. Note that, the inner surface of first guide groove 140, that is, that surface towards the side at which the pair of slide bodies 112 face each other is referred to as first inside guide groove 140a; the outer surface of first guide groove 140, that is, that surface towards the side at which the pair of slide bodies 112 do not face each other is referred to as second outside guide groove 140b. Further, second guide groove 142 is formed on an upper surface of curved section 133 so as to extend to the opposite side to the tip of curved section 133, that is, towards the base of curved section 133. Second guide groove 142 is connected to second insertion hole 136 at one end and is open to the side surface of the base section of curved section 133.

Figure 15:
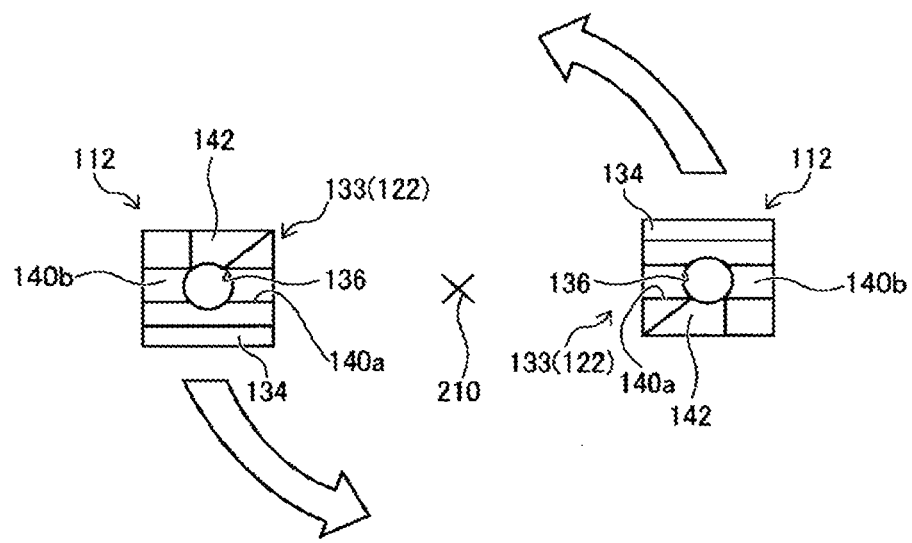
FIG. 15 is a plan view from above of a slide body.

Also, the pair of slide bodies 112 are arranged with rotational symmetry. That is, one of the pair of slide bodies 112 is arranged in a state rotated 180 degrees with respect to the other around a vertical point. Therefore, the pair of slide bodies 112 are arranged as shown in FIG. 15. In detail, second guide groove 142 of one of the pair of slide bodies 112 and second guide groove 142 of the other slide body 112 extend in different directions, and protruding section 134 of each slide body 112 is formed on the opposite side to that on which second guide groove 142 is formed, sandwiching second through-hole 136.

Also, as shown in FIG. 3, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor (refer to FIG. 7) 164. Y-direction moving device 152 includes slide rail 166 and Y slider 168. Slide rail 166 is arranged on X slider 162 extending in the Y direction, and Y slider 168 is slidably supported on slide rail 166. Y slider 168 moves in the Y direction by the driving of electromagnetic motor (refer to FIG. 7) 170. Z-direction moving device 154 includes slide rail 172 and Z slider 174. Slide rail 172 is arranged on Y slider 168 extending in the Z direction, and Z slider 174 is slidably supported on slide rail 172. Z slider 174 moves in the Z direction by the driving of electromagnetic motor (refer to FIG. 7) 176.

Further, rotation device 156 includes rotating table 178 that is roughly disc-shaped. Rotating table 178 is supported by Z slider 174 so as to be rotatable around its own center, and is rotated by the driving of electromagnetic motor (refer to FIG. 7) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. The axis center of rotation table 178 is aligned with the center point of the straight line that connects the pair of slide bodies 112. Therefore, when cut and clinch unit 100 is rotated by rotation device 156, the pair of slide bodies 112 is rotated around the center of the center point of the straight line that connects the pair of slide bodies 112. Thus, second insertion hole 136 of cut and clinch unit 100 can be positioned at any position under circuit board 12 held by clamp device 52.

Figure 7:
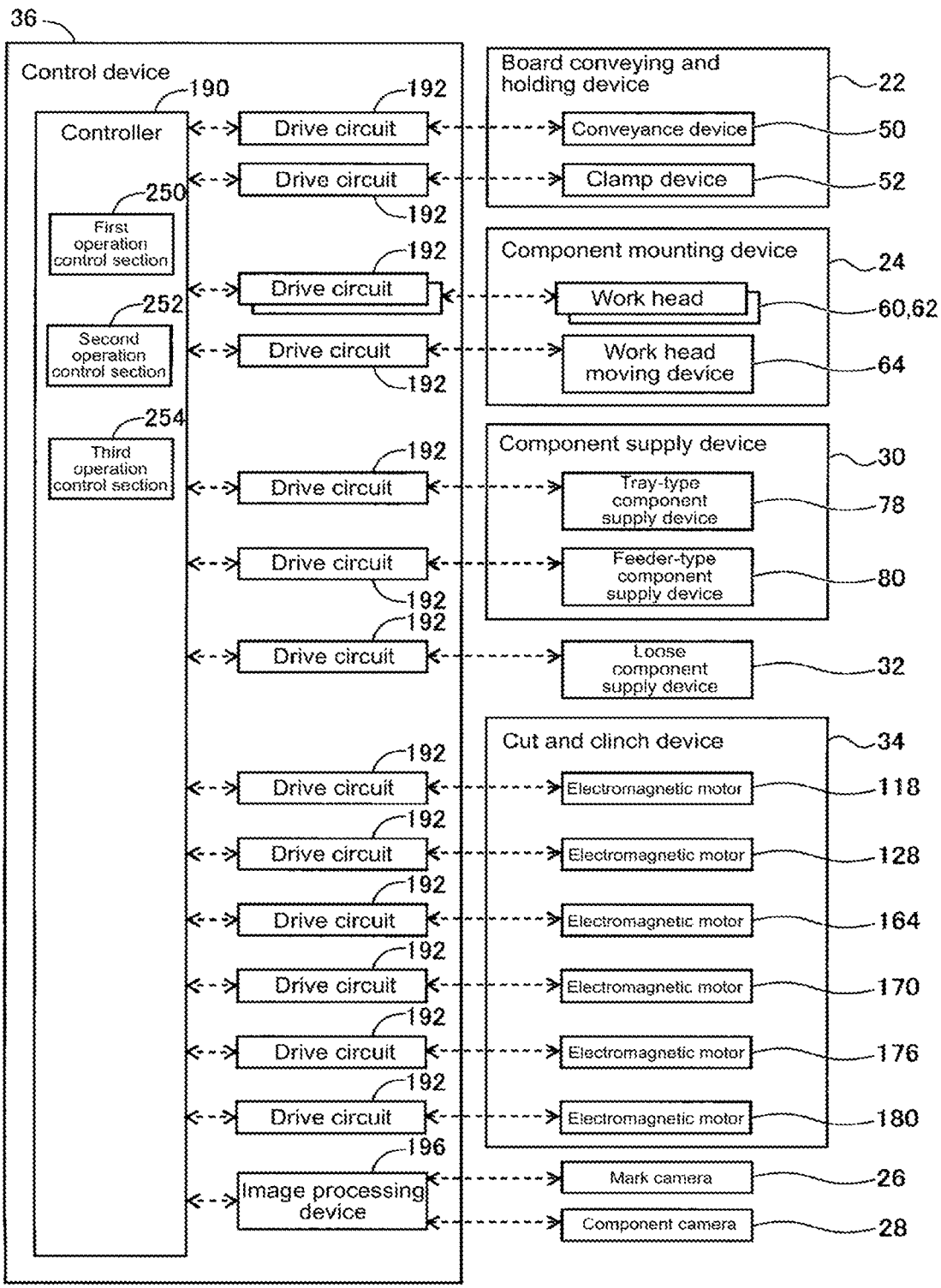
FIG. 7 is a block diagram showing a control device.

As shown in FIG. 7, control device 36 is provided with controller 190, multiple drive circuits 192, and image processing device 196. The multiple drive circuits 192 are connected to conveyance device 50, clamp device 52, work heads 60 and 62, work head moving device 64, tray type component supply device 78, feeder type component supply device 80, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which components with leads (hereinafter also referred to as "leaded component") are mounted on circuit board 12.

Figure 8:
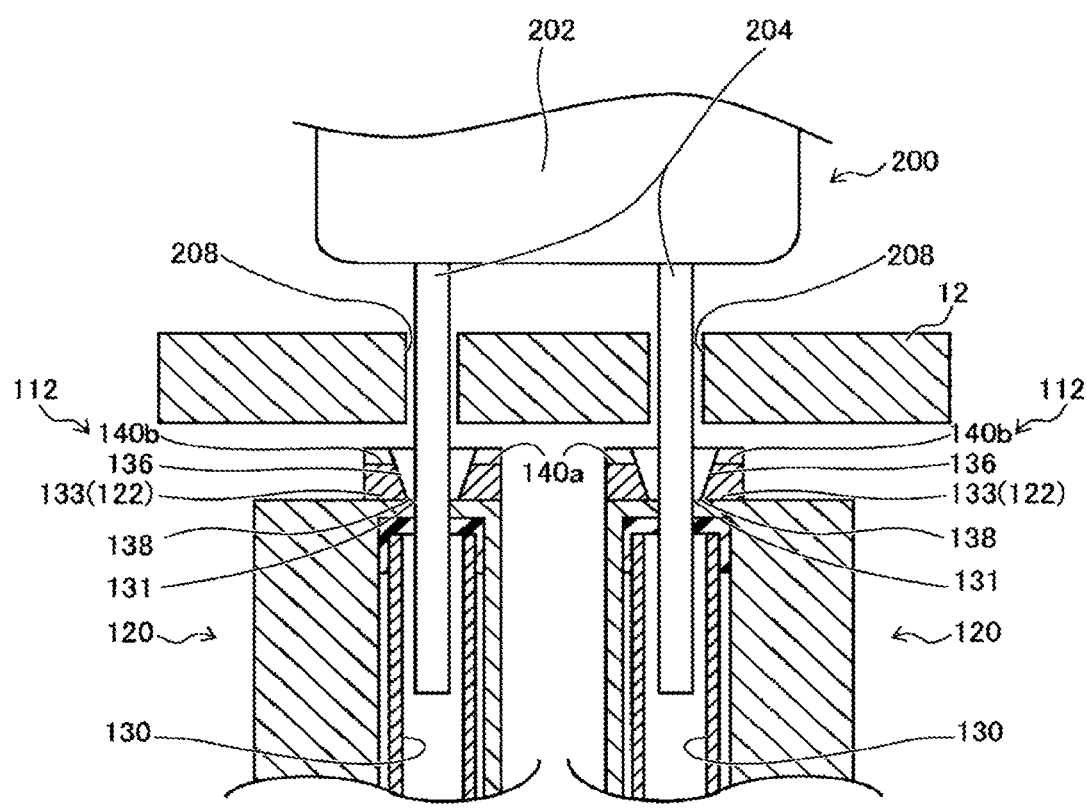
FIG. 8 is a cross section view of a cut and clinch unit immediately before leads of a leaded component are cut.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Note, as shown in FIG. 8, leaded component 200 is configured from component main body section 202, and two leads 204 protruding from the bottom surface of component fixed section 202. Leaded component 200 is picked up and held by a suction nozzle 66 on component fixed section 202.

Continuing, work head 60 or 62 holding leaded component 200 is moved above component camera 28, and leaded component 200 held by suction nozzle 66 is imaged by component camera 28. Accordingly, information related to the holding position of the component is obtained. Continuing, work head 60 or 62 holding leaded component 200 moves above circuit board 12, and corrects the error in the holding position of circuit board 12 and the error in the holding position of the component and so on. Then, the two leads 204 of leaded component 200 held by suction nozzle 66 are inserted into two through-holes 208 formed in circuit board 12. Here, cut and clinch unit 100 is moved below circuit board 12. Cut and clinch unit 100 is moved such that coordinates in the XY directions of second insertion hole 136 of movable section 122 and coordinates in the XY directions of through-hole 208 of circuit board 12 are aligned, and the upper surface of movable section 122 is slightly below the lower surface of circuit board 12.

Specifically, with cut and clinch unit 100, the distance between the pair of slide bodies 112 is adjusted by pitch changing mechanism 114 such the distance between the pair of second insertion holes 136 of movable section 122 of slide body 122 is the same as the distance between the two through-holes 208 formed in circuit board 12. And, by operation of unit moving device 102, cut and clinch unit 100 is moved in the XYZ directions and rotated. Thus, the coordinates in the XY directions of second insertion hole 136 of movable section 122 and coordinates in the XY direction of through-hole 208 of circuit board 12 are aligned. Also, as described above, because protruding section 134 that extends upwards from curved section 133 of movable section 122 is formed on an upper end surface of fixed body 120, the distance between the upper surface of movable section 122 and the lower surface of circuit board 12 is maintained by protruding section 134. Thus, an upper surface of movable section 122 is positioned slightly below the lower surface of circuit board 12.

Then, when leads 204 of leaded component 200 held by suction nozzle 66 are inserted into through-holes 208 of circuit board 12, as shown in FIG. 8, the end section of leads 204 is inserted into first insertion hole 130 of fixed section 120 through second insertion hole 136 of movable section 122 of cut and clinch unit 100. Here, because the internal surface of second insertion hole 136 positioned below through-hole 208 is tapered, even in a case in which lead 204 is bent slightly, it is possible to ensure that the tip section of lead 204 appropriately enters second insertion hole 136.

Figure 9:
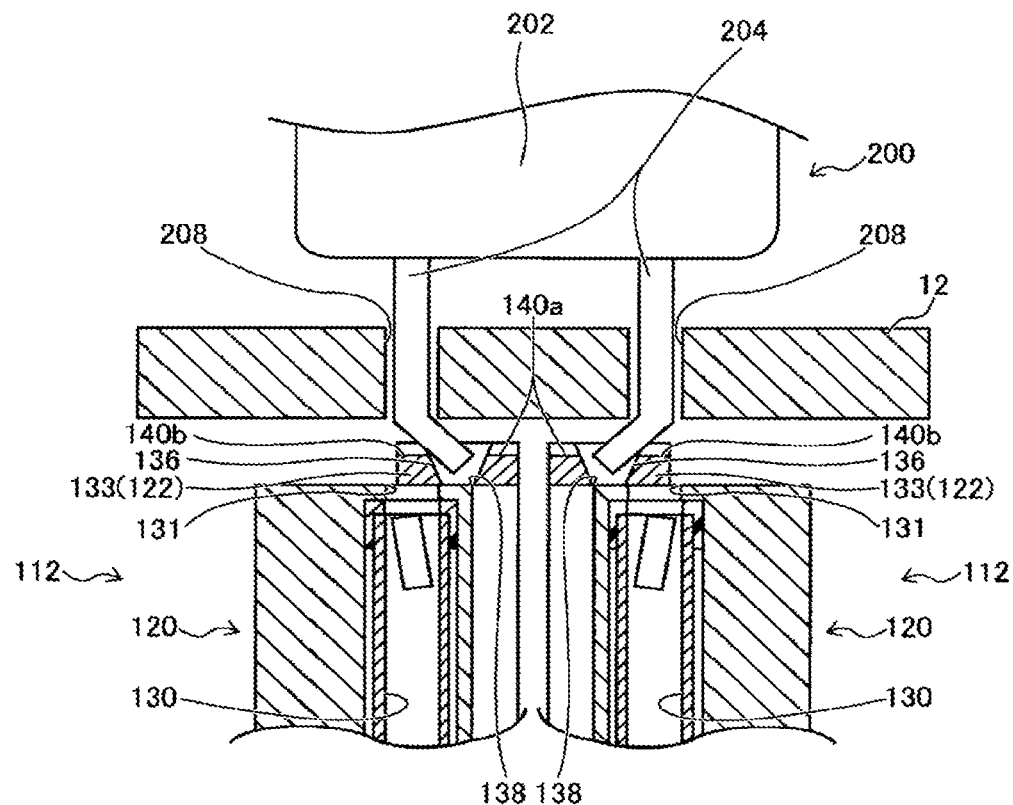
FIG. 9 is a cross section view of a cut and clinch unit after leads of a leaded component have been cut.

Next, when the tip section of lead 204 has been inserted into first insertion hole 130 via second insertion hole 136, the pair of movable sections 122 is slid by operation of slide device 124 in the direction towards each other. Thus, as shown in FIG. 9, lead 204 is cut by fixed blade 131 of first insertion hole 130 and movable blade 138 of second insertion hole 136. Then, the tip section separated by the cutting of lead 204 falls through first insertion hole 130 and is discarded in discard box 132.

Also, the pair of movable sections 122, after cutting leads 204, are slid further in the direction towards each other. Thus, the new tip section formed by the cutting of lead 204 is bent along the tapered surface of the inside of second insertion hole 136 in accordance with the sliding of movable section 122, and the tip section of lead 204 is bent along first outside guide groove 140b by the further sliding of movable section 122. Here, the pair of leads 204 are bent towards each other in the direction in which the pair of leads 204 are lined up. Thus, leaded component 200 is mounted into circuit board 12 in a state in which leads 204 are prevented from coming out of through-holes 208.

Figure 10:
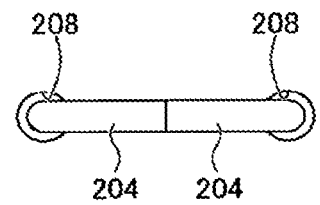
FIG. 10 is a schematic view showing bent leads in a state bent inwards.

In this manner, with component mounter 10, leaded component 200 is mounted into circuit board 12 by the pair of leads 204 being cut and bent inside (hereinafter also referred to as "bent-in state") by cut and clinch device 34. However, there are cases in which a leaded component 200 cannot be appropriately mounted on circuit board 12 in a bent-in state. Specifically, for example, in a case in which the distance between the pair of leads 204 is small, that is, the distance between the pair of through-holes 208 formed in circuit board 12 is small, a pair of leads 204 in a bent-in state, as shown in FIG. 10, may contact each other, thereby creating a short circuit. Therefore, in a case in which the distance between the pair of leads 204 is small, a leaded component 200 is mounted on circuit board 12 with the pair of leads 204 bent to the outside (hereinafter also referred to as "bent-out state")

Figure 11:
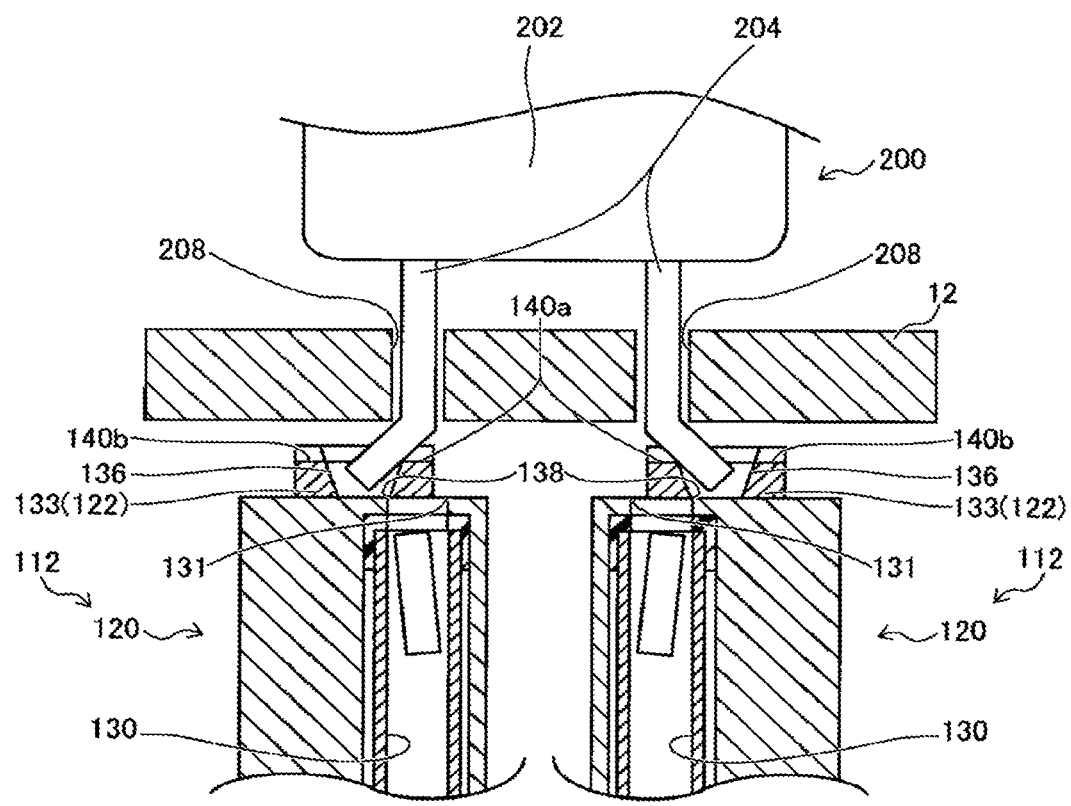
FIG. 11 is a cross section view of a cut and clinch unit after leads of a leaded component have been cut.

Specifically, similar to a case in which leaded component 200 is mounted on circuit board in a bent-in state, as shown in FIG. 8, leads 204 are inserted into first insertion hole 130 and second insertion hole 136 via through holes 208. Then, the pair of movable sections 122 are slid in a direction away from each other by operation of slide device 124. Thus, as shown in FIG. 11, lead 204 is cut by fixed blade 131 of first insertion hole 130 and movable blade 138 of second insertion hole 136. Then, the pair of movable sections 122, after cutting leads 204, are slid further in the direction away from each other. Thus, the new tip section formed by the cutting of lead 204 is bent along the tapered surface of the inside of second insertion hole 136 in accordance with the sliding of movable section 122, and the tip section of lead 204 is bent along first inside guide groove 140a by the further sliding of movable section 122. Here, the pair of leads 204 are bent away from each other in the direction in which the pair of leads 204 are lined up. Thus, leaded component 200 is mounted on circuit board 12 in a bent-out state.

Figure 12:
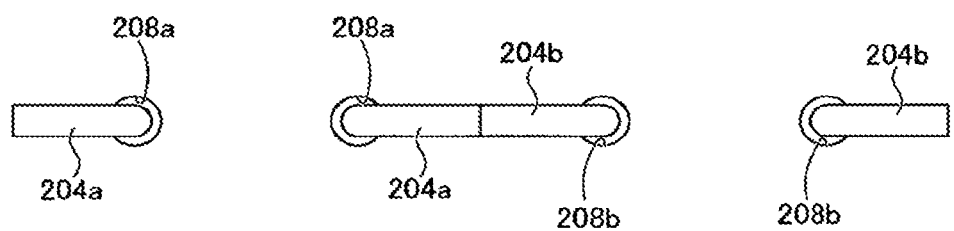
FIG. 12 is a schematic view showing leads in a bent state.

However, there are cases in which a leaded component 200 cannot be appropriately mounted on circuit board 12 even in a bent-out state. Specifically, for example, in a case in which the mounting positions of two leaded components 200 are close to each other in the direction in which leads 204 are lined up, as shown in FIG. 12, through-hole 208a for mounting one of the leaded components 200 and through-hole 208b for mounting the other leaded component 200 are adjacent in the direction in which leads 204 are lined up. Therefore, lead 204a of the leaded component 200 mounted in through-hole 208a in a bent-out state and 204b of the leaded component 200 mounted in through-hole 208b in a bent-out state contact each other, causing a short circuit. Thus, in such a case, leaded component 200 is mounted on circuit board 12 in a state with the pair of leads 204 bent in an N-shape (hereinafter also referred to as "N-bent state").

Figure 13:
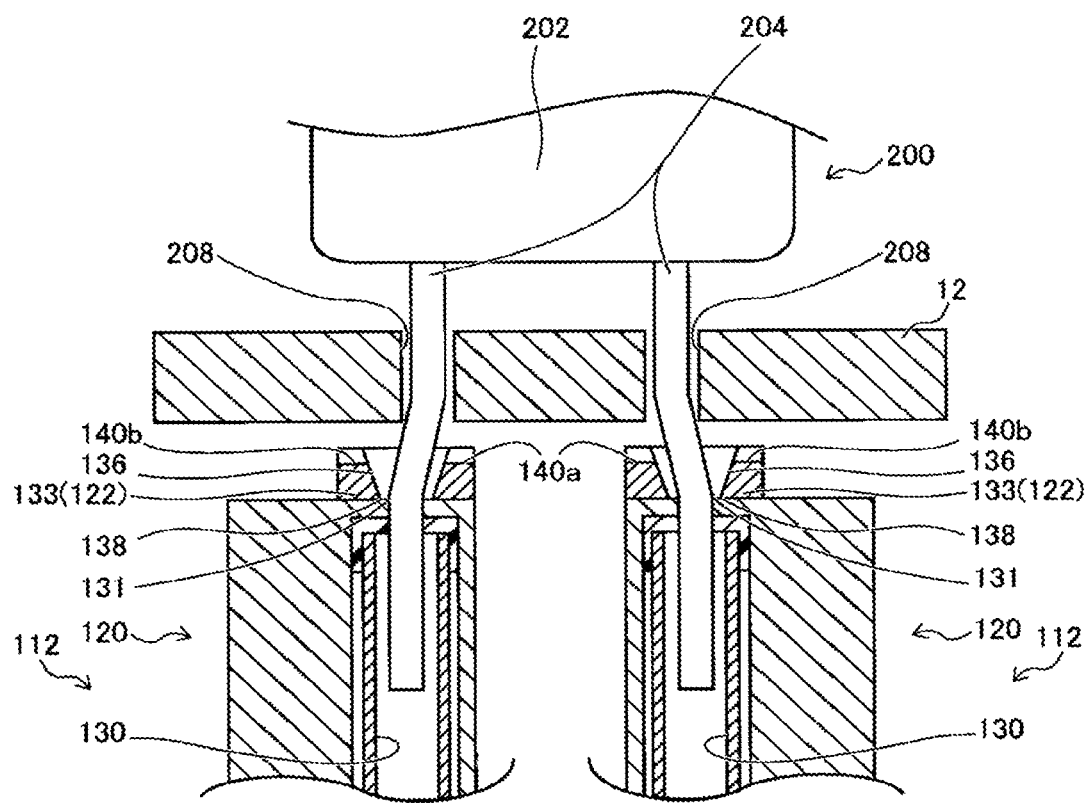
FIG. 13 is a cross section view showing a cut and clinch unit after leads of a leaded component have been bent.

Specifically, similar to a case in which leaded component 200 is mounted on circuit board 12 in a bent-in state or a bent-out state, as shown in FIG. 8, leads 204 are inserted into first insertion hole 130 and second insertion hole 136 via through holes 208. Next, as shown in FIG. 13, the pair of slide bodies 112 is moved such that distance between the pair of slide bodies 112 increases. That is, the pair of slide bodies 112 are slid away from each other. By this, the pair of leads 204 are slightly bent away from each other.

Note that, the sliding amount of slide bodies 112 is set such that the blade edge of fixed blade 131 that cuts leads 204 when movable section 122 is moved to the inside, and the location of the base end of lead 204 closest to the slide body 112 on the outer surface are aligned in the vertical direction. That is, slide body 112 is slid such that the base end of lead 204 and first insertion hole 130 slightly overlap in the vertical direction.

Figure 14:
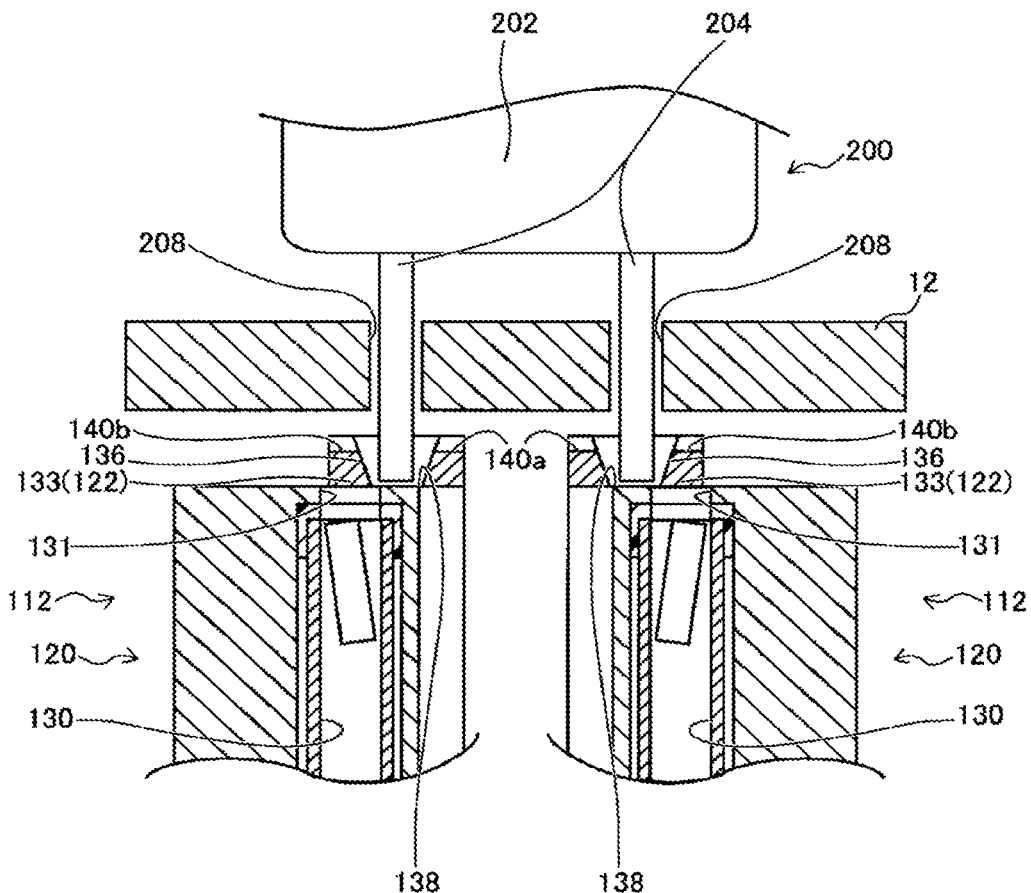
FIG. 14 is a cross section view of a cut and clinch unit after leads of a leaded component have been cut.

When the pair of slide bodies 112 are slid in a direction away from each other, the pair of movable sections 122 are slid in a direction towards each other by operation of slide device 124. Thus, as shown in FIG. 14, lead 204 is cut by fixed blade 131 of first insertion hole 130 and movable blade 138 of second insertion hole 136. Then, when leads 204 has been cut, sliding of movable sections 122 stops. Here, through-hole 208 and second insertion hole 136 of movable section 122 are substantially aligned in the vertical direction. This is because the sliding amount of slide bodies 112 is set as described above. Thus, leads 204 that were bent by the sliding of slide bodies 112 are returned to an approximate straight line by the sliding of movable sections 122.

Next, cut and clinch unit 100 is rotated by operation of rotation device 156. Here, as shown in FIG. 15, the pair of slide bodies 112 is rotated around center point 210 of a straight line that joins the pair of slide bodies 112. Note that, the pair of slide bodies 112 are rotated such that protruding section 134 moves forwards. That is, the pair of slide bodies 112 are rotated such that protruding section 134 is positioned at the front, and second guide groove 142 is positioned at the rear. Thus, when slide bodies 112 are rotated, there is no interference between leads 204 and protruding sections 134.

Figure 16:
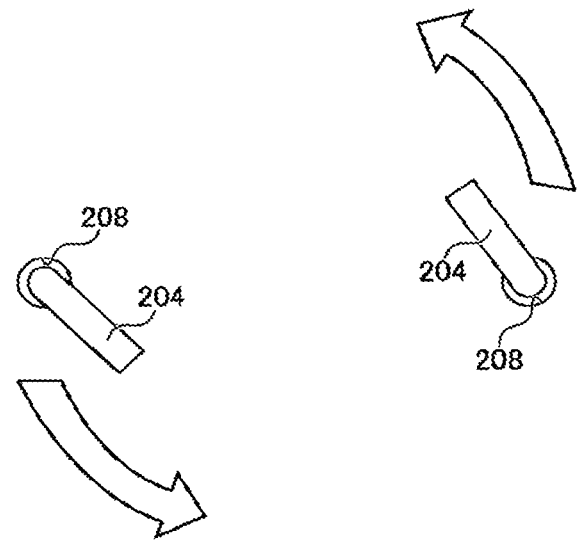
FIG. 16 is a schematic view showing leads bent into an N-shape.

In this case, lead 204 inserted into second insertion hole 136 is bent along the tapered surface on the inside of second insertion hole 136 in accordance with the rotation of slide bodies 112. Also, by rotating slide bodies 112 further, the tip section of lead 204 is bent along second guide groove 142. One portion of the inside wall of second guide groove 142 is formed in a direction perpendicular to the direction of first guide groove 140, and another portion of the inside wall of second guide groove 142 is formed along the rotation direction of slide bodies 112. Thus, lead 204 is bent along the other portion of the inside wall of second guide groove 142, and as shown in FIG. 16, the pair of leads 204 are bent away from each in a direction different to the direction in which the pair of leads 204 is lined up. That is, the pair of leads 204 is bent in approximately an N-shape. Thus, leaded component 200 is mounted on circuit board 12 in an N-bent state.

Figure 17:
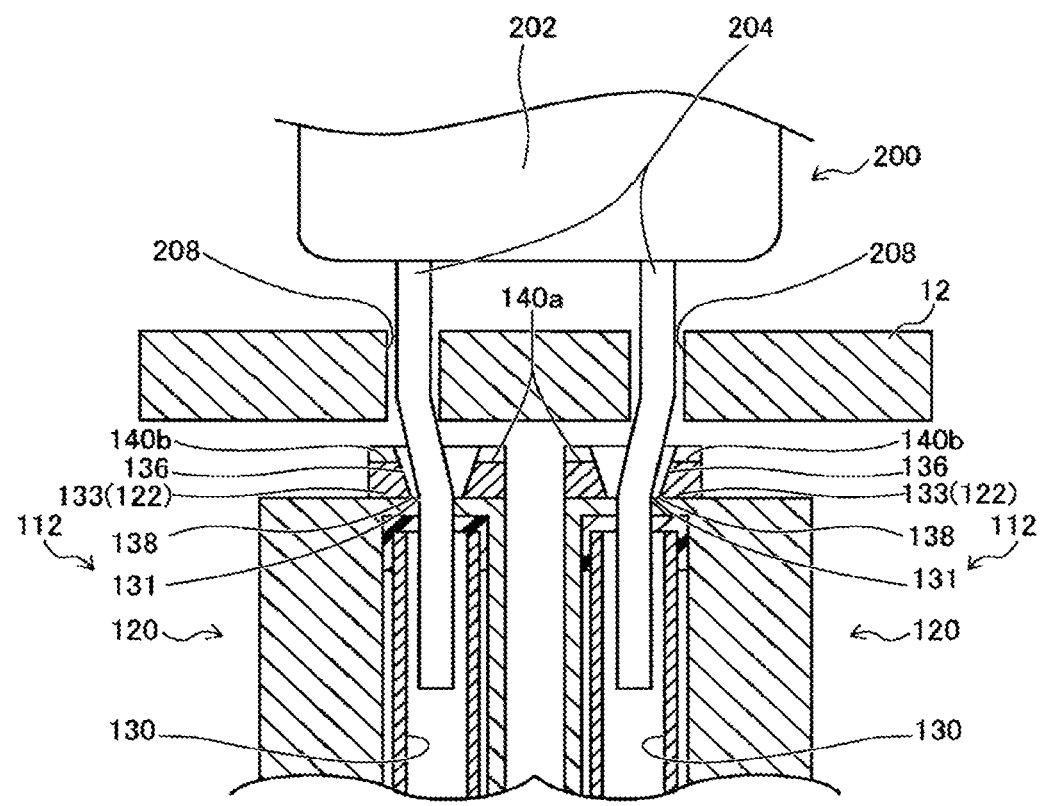
FIG. 17 is a cross section view showing a cut and clinch unit after leads of a leaded component have been bent.

Also, it is possible to mount a leaded component 200 on circuit board 12 in an N-bent state using a different method to that above. Specifically, similar to a case in which leaded component 200 is mounted on circuit board in a bent-in state or a bent-out state, as shown in FIG. 8, leads 204 are inserted into first insertion hole 130 and second insertion hole 136 via through holes 208. Next, as shown in FIG. 17, the pair of slide bodies 112 is moved such that distance between the pair of slide bodies 112 decreases. That is, the pair of slide bodies 112 are slid towards each other. By this, the pair of leads 204 are slightly bent towards each other. Note that, the sliding amount of slide bodies 112 is set in a similar way to that for the method above.

Figure 18:
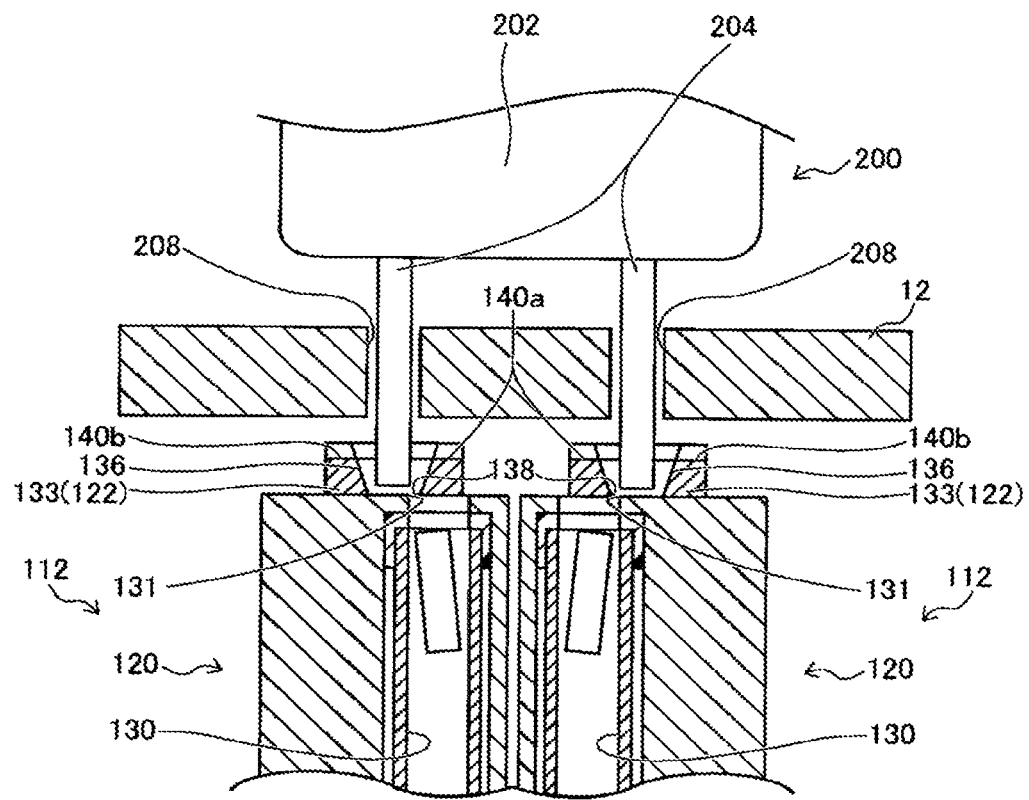
FIG. 18 is a cross section view of a cut and clinch unit after leads of a leaded component have been cut.

When the pair of slide bodies 112 are slid in a direction towards each other, the pair of movable sections 122 are slid in a direction away from each other by operation of slide device 124. Thus, as shown in FIG. 18, lead 204 is cut by fixed blade 131 of first insertion hole 130 and movable blade 138 of second insertion hole 136. Then, when leads 204 has been cut, sliding of movable sections 122 stops. Here, through-hole 208 and second insertion hole 136 of movable section 122 are substantially aligned in the vertical direction. Thus, leads 204 that were bent by the sliding of slide bodies 112 are returned to an approximate straight line by the sliding of movable sections 122.

Next, by rotating cut and clinch unit 100 by operation of rotation device 156, as shown in FIG. 15, the pair slide bodies 112 are rotated around center point 210 of a straight line that connects the pair of slide bodies 112. Note that, the pair of slide bodies 112 are rotated such that protruding section 134 moves forwards. Lead 204 inserted into second insertion hole 136 is bent along the tapered surface on the inside of second insertion hole 136 in accordance with the rotation of slide bodies 112. Also, by rotating slide bodies 112 further, the tip section of lead 204 is bent along second guide groove 142. By this, as shown in FIG. 16, the pair of leads 204 is bent into an approximate N-shape, and leaded component 200 is mounted on circuit board 12 in an N-bent state.

In this manner, it is possible to mount a leaded component 200 on circuit board 12 in accordance with one method out of: a method that cuts leads 204 by sliding the pair of slide bodies 112 in a direction away from each other and sliding the pair of movable sections 122 towards each other and then bends leads 204 into an N-bent state by rotating cut and clinch unit 100 (hereinafter also referred to as a "first N-bend method"); and a method that cuts leads 204 by sliding the pair of slide bodies 112 in a direction towards each other and sliding the pair of movable sections 122 away from each other and then bends leads 204 into an N-bent state by rotating cut and clinch unit 100 (hereinafter also referred to as a "second N-bend method").

Note that, when the distance between the pair of leads 204 is short, it is desirable to use the first N-bend method; when the distance between the pair of leads 204 is long, it is desirable to use the second N-bend method.

Figure 19:
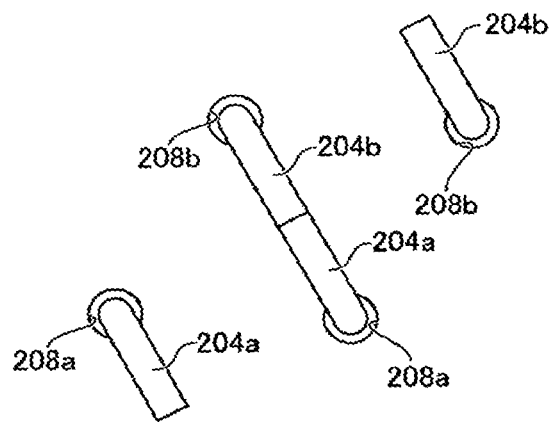
FIG. 19 is a schematic view showing leads bent into an N-shape.

However, there are cases in which a leaded component 200 cannot be appropriately mounted on circuit board 12 even in an N-bent state. Specifically, for example, in a case in which the mounting positions of two leaded components 200 are close to each other in a direction different to the direction in which leads 204 are lined up, as shown in FIG. 19, through-hole 208a for mounting one of the leaded components 200 and through-hole 208b for mounting the other leaded component 200 are adjacent in the direction different to the direction in which leads 204 are lined up. Therefore, lead 204a of the leaded component 200 mounted in through-hole 208a in a bent-out state and 204b of the leaded component 200 mounted in through-hole 208b in a bent-out state contact each other, causing a short circuit. Thus, in such a case, leaded component 200 is mounted on circuit board 12 in a bent-out state or a bent-in state.

In this manner, with cut and clinch device 34, it is possible to mount a leaded component 200 on circuit board 12 in a bent-in state, a bent-out state, or an N-bent state. Thus, it is possible to mount leaded component 200 on circuit board 12 in various ways, for example, even in a case in which multiple leaded components 200 are to be mounted on circuit board 12 densely, leaded components 200 can be appropriately mounted on circuit board 12 without causing short circuits of leads 204.

Note that, controller 190 of control device 36, as shown in FIG. 7, includes first operation control section 250, second operation control section 252, and third operation control section 254. First operation control section 250 is a functional section for mounting leaded component 200 on circuit board 12 in a bent-in state. Second operation control section 252 is a functional section for mounting leaded component 200 on circuit board 12 in a bent-out state. Third operation control section 254 is a functional section for mounting leaded component 200 on circuit board 12 in an N-bent state.

Also, cut and clinch device 34 is an example of a cutting and bending device, and of a cutting device. Control device 36 is an example of a control device. Unit main body 110 is an example of a holding section. Slide body 112 is an example of a main body section. Fixed section 120 is an example of a first section. Movable section 122 is an example of a movable section. First insertion hole 130 is an example of a first through-hole. Protruding section 134 is an example of a protruding section. Second insertion hole 136 is an example of a second through-hole. First guide groove 140 is an example of a first guide groove. Second guide groove 142 is an example of a second groove. Rotation device 156 is example of a rotation mechanism. Leaded component 200 is an example of a leaded component. Lead 204 is an example of a lead. First operation control section 250 is an example of a first operation control section. Second operation control section 252 is an example of a second operation control section. Third operation control section 254 is an example of a third operation control section.

Further, the present disclosure is not limited to the above example embodiments, and various changed or improved methods of embodiment are possible based on the knowledge of someone skilled in the art. Specifically, for example, in an embodiment above, the disclosure is applied to cut and clinch device 34 that cuts and bends leads 204, but the disclosure may be applied to a lead cutting device that simply cuts leads 204. That is, the present disclosure can be applied to a device that, when mounting leaded component 200 on circuit board 12 in an N-bent state, cuts leads 204 by sliding the pair of slide bodies 112 in one of a direction away from each other and a direction towards each other, and then sliding the pair of movable sections 122 in the other of the direction away from each other and the direction towards each other. By this, it is possible to make cut leads 204 be straight.

Also, in an embodiment above, suction nozzle 66 is used as a holding tool that holds leaded component 200, but items such as a lead chuck that grasps leads 204 of leaded component 200 or a body chuck that grasps component fixed section 202 of leaded component 200 may be used.

Also, in an embodiment above, as shown in FIG. 15, leads 204 are bent in an N-bent state as shown in FIG. 19 by rotating cut and clinch 100 counterclockwise, but leads 204 may be bent into a reverse N-bent state opposite to the N-bent state of FIG. 19 by rotating count and clinch unit 100 in clockwise. However, to achieve a reverse N-bent state, protruding section 134 and second guide groove 142 must be set on the opposite sides of second insertion hole 136 to the positions shown in FIG. 15.

REFERENCE SIGNS LIST

34: cut and clinch device (cutting and bending device) (cutting device); 36: control device; 110: unit main body (holding section); 112: slide body (main body section); 120: fixed section (first section); 122: movable section (second section); 130: first insertion hole (first through-hole); 134: protruding section; 136: second insertion hole (second through-hole); 140a: first inside guide groove (first groove); 140b: first outside guide groove (first groove); 142: second guide groove (second groove); 156: rotation device (rotation mechanism); 200: leaded component; 204: lead; 250: first operation control section; 252: second operation control section; 254: third operation control section

The invention claimed is:
1. A cutting and bending device comprising:
a pair of main body sections each including
   (A) a first section in which is formed a first through-hole, and
   (B) a second section in which is formed a second through-hole formed so as to overlap with the first through-hole and that is configured to slide with respect to the first section;
a holding section configured to hold the pair of main body sections so as to move towards and away from each other in the sliding direction of the second section;
a rotation mechanism configured to rotate the holding section around a vertical axis of the holding section, the rotation mechanism including a rotating table connected to a lower portion of the holding section; and
a control device including
   a first operation control section configured to bend a pair of leads of a leaded component towards each other in a first direction that is a direction in which the pair of leads are lined up after the pair of leads has been cut,
   a second operation control section configured to bend the pair of leads of the leaded component away from each other in the first direction, and
   a third operation control section configured to rotate the holding section using the rotation mechanism and to bend the pair of leads of the leaded component away from each other in a direction that is different to the first direction.
2. The cutting and bending device according to claim 1, wherein
the first operation control section is configured to bend the pair of leads towards each other in the first direction by sliding the pair of second sections further in the direction towards each other after inserting the leads into the first through-hole and the second through-hole that are overlapping and sliding the pair of second sections towards each other so as to cut the pair of leads,
the second operation control section is configured to bend the pair of leads away from each other in the first direction by sliding the pair of second sections further in the direction away from each other after inserting the leads into the first through-hole and the second through-hole that are overlapping and sliding the pair of second sections away from each other so as to cut the pair of leads, and
the third operation control section is configured to bend the pair of leads in a direction away from each other that is different to the first direction by rotating the holding section using the rotation mechanism after inserting the leads into the first through-hole and the second through-hole that are overlapping and, in a state with the pair of main body sections moved in one direction out of the direction towards each other and the direction away from each other, sliding the pair of second sections in another direction out of the direction towards each other and the direction away from each other so as to cut the pair of leads.
3. The cutting and bending device according to claim 1, wherein
the second section includes
a first groove formed in an upper surface of the second section so as to extend in the sliding direction of the second section, and
a second groove formed in an upper surface of the second section so as to extend in an opposite direction to a direction in which the holding section is rotated by the third operation control section.
4. The cutting and bending device according to claim 1, wherein
each of the pair of main body sections includes a protruding section formed in a portion of an upper surface of one of the first section and the second section in a direction in which the holding section is rotated by the third operation control section.
5. A cutting and bending device comprising:
a pair of main body sections each including
   (A) a first section in which is formed a first through-hole, and
   (B) a second section in which is formed a second through-hole formed so as to overlap with the first through-hole and that is configured to slide with respect to the first section;
a holding section configured to hold the pair of main body sections so as to move towards and away from each other in the sliding direction of the second section;
a rotation mechanism configured to rotate the holding section around a vertical axis of the holding section, the rotation mechanism including a rotating table connected to a lower portion of the holding section;
a first groove formed in an upper surface of the second section so as to extend in the sliding direction of the second section; and
a second groove formed in an upper surface of the second section so as to extend in an opposite direction to a direction in which the holding section is rotated.

* * * * *